(12) United States Patent
Ohtsuka

(10) Patent No.: US 6,812,687 B1
(45) Date of Patent: Nov. 2, 2004

(54) SEMICONDUCTOR CURRENT DETECTOR OF IMPROVED NOISE IMMUNITY

(75) Inventor: Koji Ohtsuka, Kawagoe (JP)

(73) Assignee: Sanken Electric Co., Ltd. (JP)

( * ) Notice: Subject to any disclaimer, the term of this patent is extended or adjusted under 35 U.S.C. 154(b) by 305 days.

(21) Appl. No.: 09/724,979

(22) Filed: Nov. 28, 2000

(30) Foreign Application Priority Data

Dec. 9, 1999 (JP) ............................................. 11-350064
Aug. 21, 2000 (JP) ...................................... 2000-249472

(51) Int. Cl.[7] ............................................. G01R 33/00
(52) U.S. Cl. ................................................. 324/117 H
(58) Field of Search ........................... 324/117 H, 251, 324/252, 207.2; 327/511; 257/421, 422, 423, 424, 425, 426, 427

(56) References Cited

U.S. PATENT DOCUMENTS

| | | | | |
|---|---|---|---|---|
| 4,963,827 A | * | 10/1990 | Popovic et al. | ............. 324/251 |
| 5,041,780 A | * | 8/1991 | Rippel | ................... 324/117 H |
| 5,583,429 A | * | 12/1996 | Otaka | .................... 324/117 H |
| 6,356,068 B1 | * | 3/2002 | Steiner et al. | ........... 324/117 H |
| 6,462,531 B1 | * | 10/2002 | Ohtsuka | ................. 324/117 H |
| 6,545,456 B1 | * | 4/2003 | Radosevich et al. | .... 324/117 H |

FOREIGN PATENT DOCUMENTS

| | | |
|---|---|---|
| JP | 53-7183 | 1/1978 |
| JP | 4-364472 | 12/1992 |
| JP | 10-282156 | 10/1998 |
| JP | 10-293141 | 11/1998 |

* cited by examiner

*Primary Examiner*—Anjan Deb
*Assistant Examiner*—Amy He
(74) *Attorney, Agent, or Firm*—Woodcock Washburn LLP

(57) ABSTRACT

A current detector has a semiconductor Hall-effect device having a primary semiconductor region where a Hall voltage develops in proportion to the magnitude of the current to be detected. A conductor strip for carrying this current is formed on the semiconductor substrate via a plurality of insulating layers so as to extend around the primary semiconductor region of the Hall-effect device. In order to protect the Hall-effect device from inductive noise, a shielding layer of molybdenum or the like is interposed between the semiconductor substrate and the conductor strip, preferably by being sandwiched between the insulating layers.

5 Claims, 9 Drawing Sheets

SEMICONDUCTOR CURRENT DETECTOR OF IMPROVED NOISE IMMUNITY

BACKGROUND OF THE INVENTION

This invention relates to current detectors, more specifically to that employing a semiconductor Hall-effect device for obtaining a voltage proportional to the magnitude of the current detected. Still more specifically, the invention deals with how to improve the noise immunity of this kind of current detector.

By the term "Hall-effect device" used herein and in the claims appended hereto is meant the voltage generator built on the familiar Hall effect to give an output voltage in direct proportion to the magnetic field applied. Disposed contiguous to a current path, the Hall-effect device will be subjected to the magnetic field that is generated in proportion to the magnitude of the current flowing through the path. The result will be the production of a voltage proportional to the current magnitude.

The instant applicant proposed in PCT/JP99/05408 a current detector in which an insulating film is formed upon a semiconductor Hall-effect device and, on this insulating film, a conductor layer for carrying a current to be detected. The current path is thus situated as close as feasible to the Hall-effect device, resulting in enhancement of the sensitivity of the current detector.

This prior art current detector proved to be unsatisfactory, however, in its noise immunity. It was equipped with no means designed explicitly for protection of the device against production of spurious voltage signals due to external disturbances.

SUMMARY OF THE INVENTION

The present invention seeks to enhance the noise immunity, and hence the reliability of operation, of the current detector of the type defined.

Stated in brief, the invention concerns a semiconductor current detector comprising a semiconductor substrate having a Hall-effect device formed therein from one surface thereof, the Hall-effect device having a plurality of semiconductor regions including a primary working region for generating a Hall voltage proportional to the magnitude of a current or to be detected or measured. A conductor strip is formed over said one surface of the semiconductor substrate via insulating means so as to extend around at least part of the primary working region of the Hall-effect device, for carrying at least a prescribed fraction of the current to be translated into the Hall voltage. A shielding layer is formed in the insulating means for shielding the Hall-effect device from external disturbances.

Typically, the insulating means is a lamination of three insulating layers. Electrodes, as well as conductor strips joined thereto, are formed on a first insulating layer which directly overlies the semiconductor substrate. The shielding layer is formed on part of a second insulating layer which overlies the first insulating layer. The conductor strip is formed on a third insulating layer overlying the second insulating layer.

The above arrangement of the three insulating layers in relation to the shielding layer and other components of the current detector is not a requirement. Alternatively, for instance, the shielding layer may be provided on the third insulating layer, and the conductor strip between the second and the third insulating layer. As a further alternative, a fourth insulating layer may be provided over the third insulating layer, and a second shielding layer on this fourth insulating layer.

Shielded by one or more shielding layers as above, the current detector will detect currents without errors due to external disturbances. The shielding layer or layers, as well as the current-carrying conductor strip, are integrally built into the semiconductor current detector, so that no substantial increase in size results from the addition of the shielding layer or layers. The integration of the conductor strip with the Hall-effect device is desirable by reason of their unvarying positional stability, and hence a consistently high accuracy of detection, from one current detector to another.

The above and other objects, features and advantages of the invention and the manner of realizing them will become more apparent, and so the invention itself will best be understood, from the following description taken together with the attached drawings showing the preferred embodiments of the invention.

DESCRIPTION OF THE PREFERRED EMBODIMENTS

Figure 1:
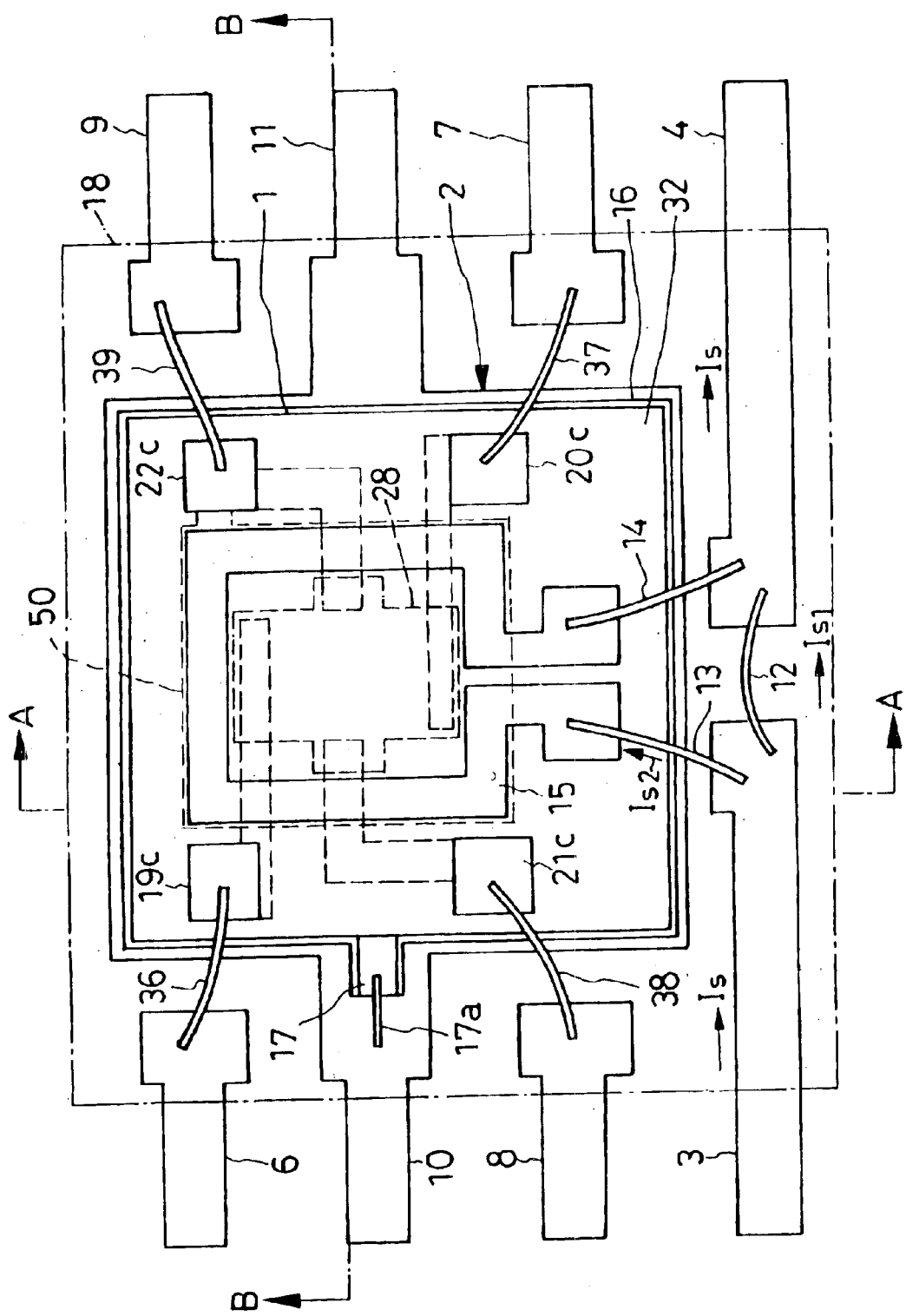
FIG. 1 is a plan view of the current detector embodying the principles of the instant invention, the view not showing the fourth insulating layer and the magnetic collector, and showing the encapsulation in phantom outline, to reveal other parts.
Figure 2:
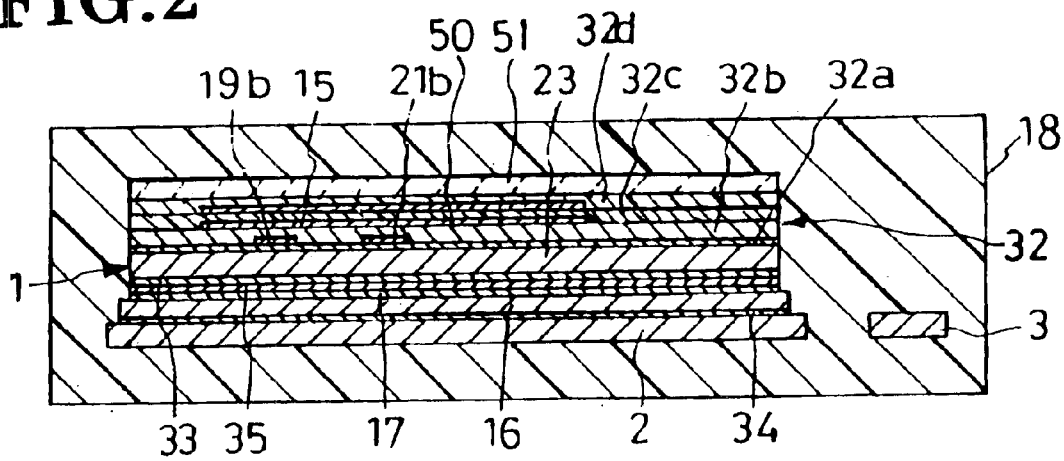
FIG. 2 is a section through the current detector, taken along the line A—A In FIG. 1.

The general organization of the first preferred form of current detector according to the invention will become apparent from a study of FIGS. 1 and 2. The current detector comprises:

1. a semiconductor Hall-effect device 1 for providing an output voltage indicative of the magnitude of a current is to be detected or measured;
2. a metal-made baseplate 2 mechanically supporting the Hall-effect device;
3. two current path terminals 3 and 4 for the inflow and outflow, respectively, the current Is;

4. four lead terminals 6, 7, 8 and 9 for connection of the Hall-effect device 1 to external circuits;

5. two other terminals 10 and 11 for grounding the baseplate 2;

6. a wire or like conductor 12 bridging the current path terminals 3 and 4 for providing a first current path from the former to the latter for carrying a first fraction $Is_1$ of the current Is;

7. two other wires or like conductors 13 and 14 and a strip 15 of conductor layer conjointly providing a second current path from the current path terminal 3 to 4 for carrying a second fraction $Is_2$ of the current Is, which fraction is to be translated into a voltage signal by the Hall-effect device 1;

8. an insulating plate 16 between Hall-effect device 1 and baseplate 2;

9. a first or bottom shielding layer 17 between Hall-effect device 1 and insulating plate 16;

10. a second or top shielding layer 50 overlying the Hall-effect device 1;

11. a magnetic collector 51 further overlying the top shielding layer 50; and 12. a plastic encapsulation 18 enclosing all of the current detector but parts of the noted terminals 3, 4 and 6–11.

Figure 3:
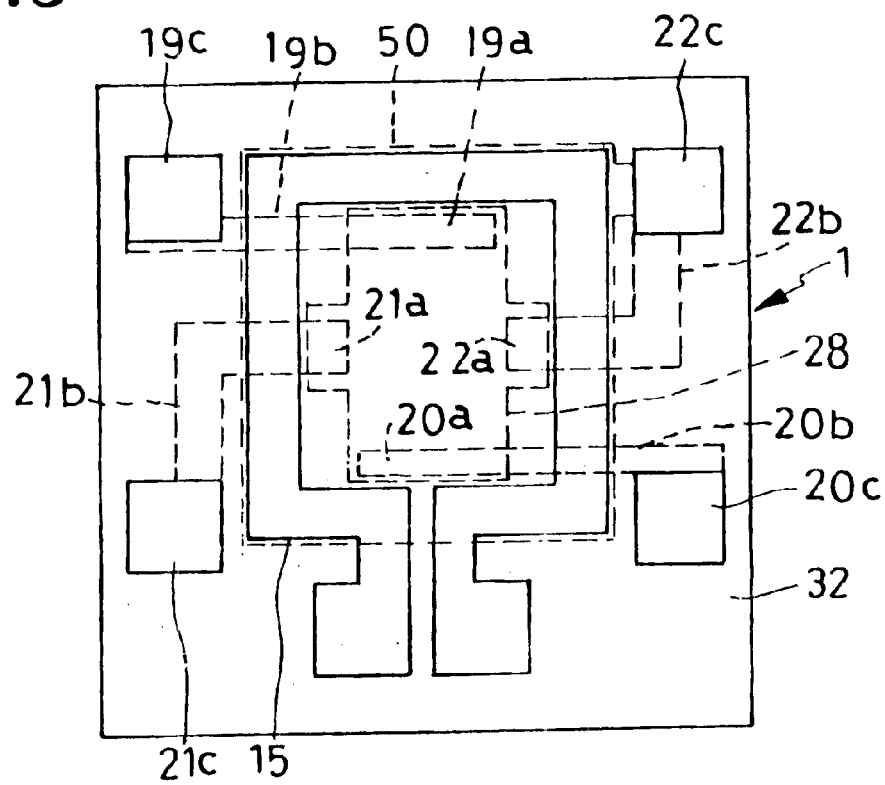
FIG. 3 is a plan view of the Hall-effect device included in the FIG. 1 current detector.
Figure 4:
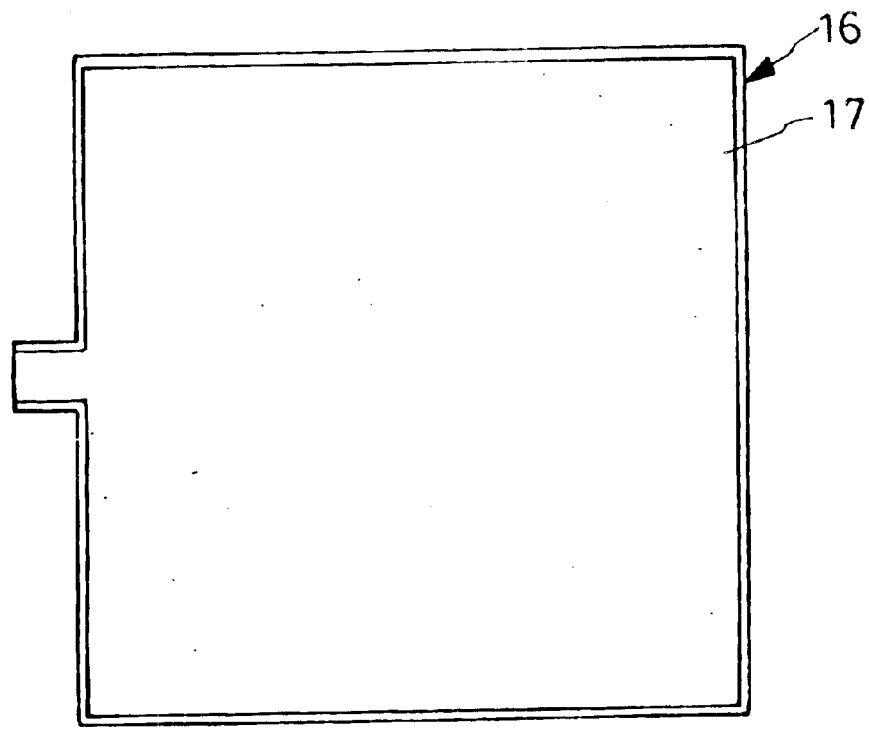
FIG. 4 is a plan view of the insulating plate, together with the bottom shielding layer thereon, included in the FIG. 1 current detector.

As depicted by itself in FIG. 3, the Hall-effect device 1 is of generally rectangular shape as seen in a plan view as in this figure, and has four electrodes 19a, 20a, 21a and 22a near its geometric center. These electrodes 19a–22a are connected via conductor strips 19b–22b to terminals 19c–22c, respectively, of the Hall-effect device.

The Hall-effect device 1 is to be put to use with the terminals 19c and 20c connected to an external circuit, not shown, for inputting a control current, and with the terminals 21c and 22c connected to an external differential amplifier, also not shown, for putting out the Hall voltage. The control current input terminals 19c and 20c, and therefore the electrodes 19a and 20a, are connected respectively to a pair of semiconductor regions 24 and 25, FIG. 7, of a semiconductor substrate 23 in which the device is formed. The voltage output terminals 21c and 22c, and therefore the electrodes 21a and 22a, are connected respectively to semiconductor regions 26 and 27 of the substrate 23.

Figure 7:
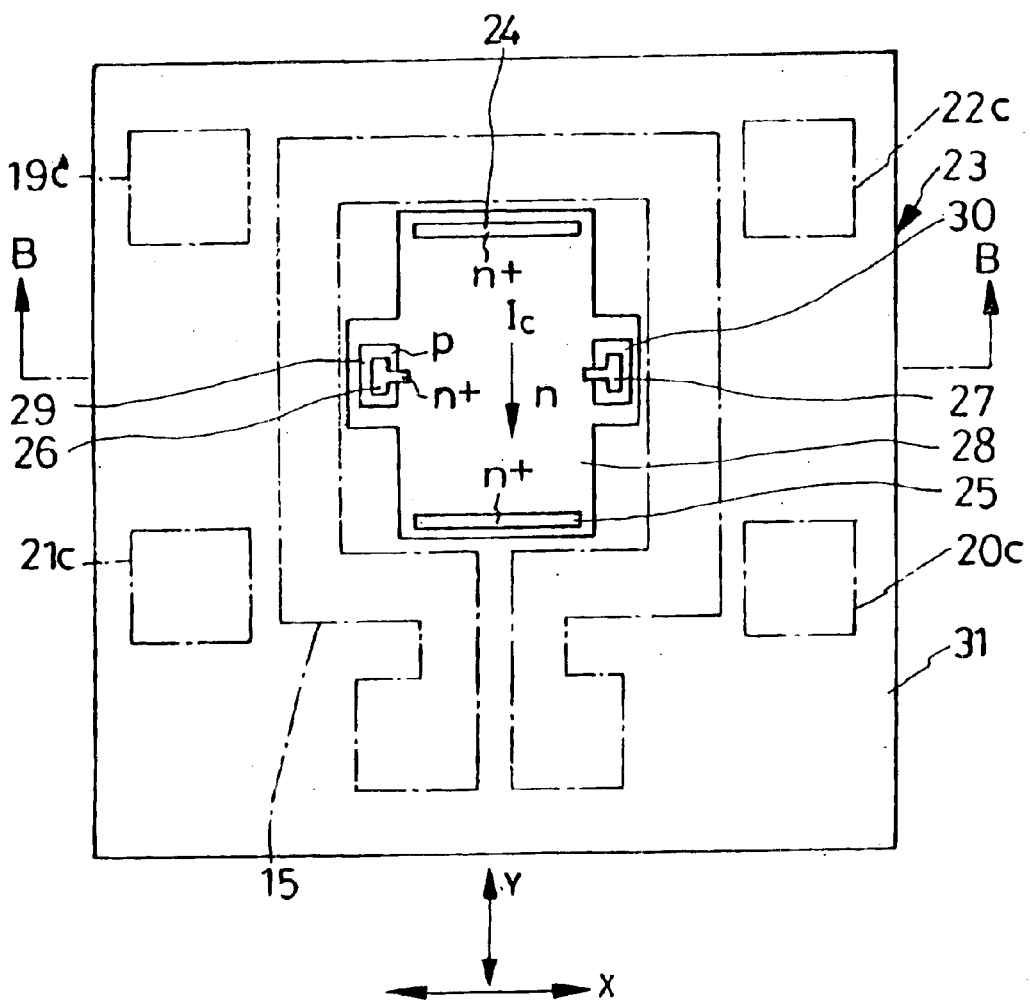
FIG. 7 is a plan view showing the semiconductor substrate of the FIG. 1 current detector on a slightly enlarged scale.
Figure 8:
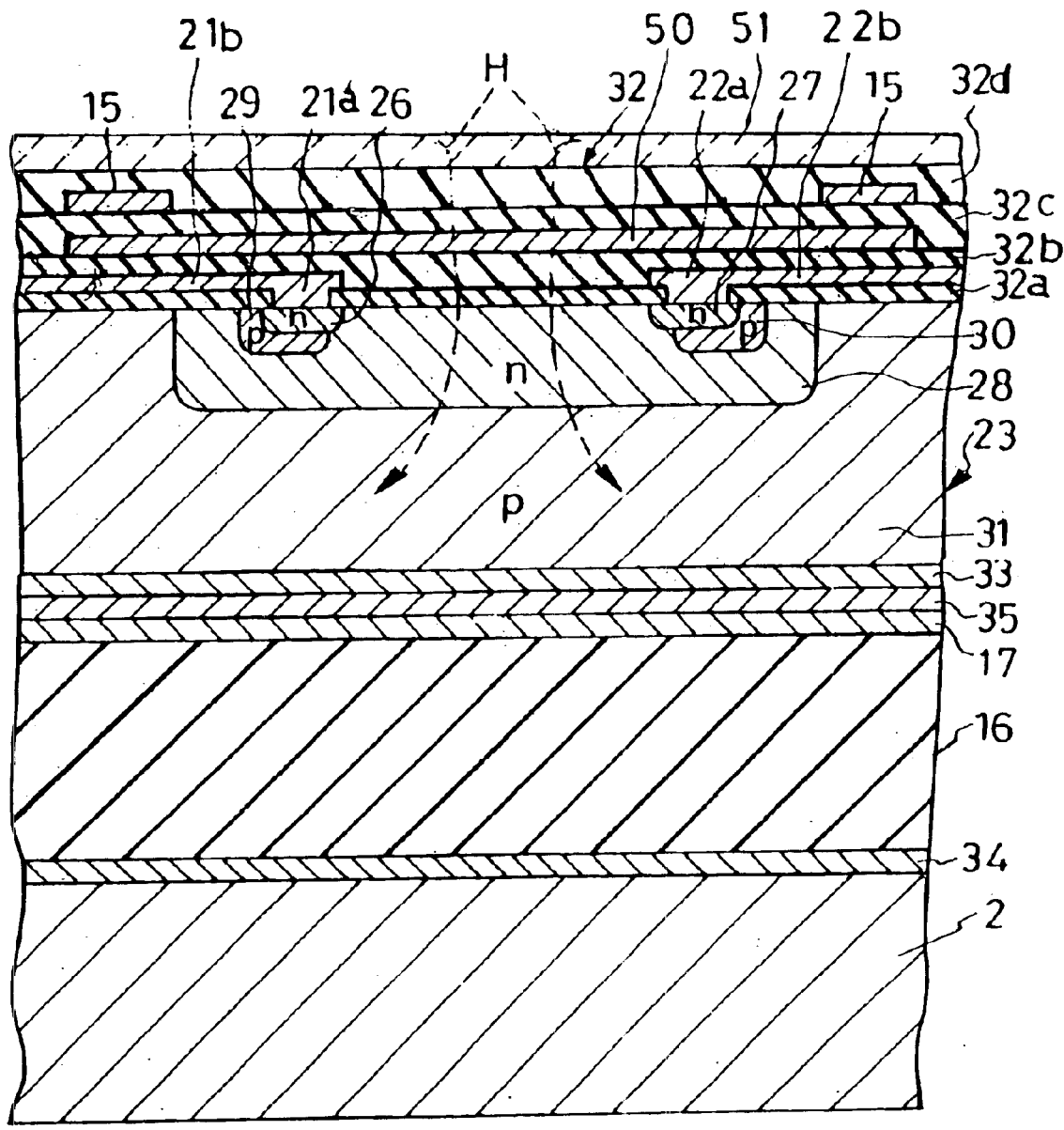
FIG. 8 is an enlarged, fragmentary section through the Hall-effect device of the FIG. 1 current detector, taken along the line B—B in FIG. 1.

With reference to both FIGS. 7 and 8 the semiconductor substrate 23 is a generally rectangular piece of silicon, having four other regions 28–31 than the four aforementioned regions 24–27 of n conductivity type. Of n conductivity type, the fifth semiconductor region 28 takes the form of an island of cross shape, as seen in a plan view as in this figure, in the middle of the p-type eighth semiconductor region 31 which occupies most part of the semiconductor substrate 23.

The noted first and second semiconductor regions 24 and 25 are of $n^+$ type, higher in impurity concentration than the fifth semiconductor region 28, and are formed as islands, spaced from each other along the y axis in FIG. 7, in the fifth semiconductor region 28. The first and second electrodes 19a and 20a are in ohmic contact with these semiconductor regions 24 and 25. When the unshown control current supply circuit is connected to the input terminals 19c and 20c, the control current $I_0$ is to flow across the fifth semiconductor region 28, either from the first 24 to the second 25 semiconductor region or the other way around.

Of $n^+$ type, with an impurity concentration higher than that of the fifth semiconductor region 28, the third and fourth semiconductor regions 26 and 27 lie approximately centrally of the fifth semiconductor region 28 in the direction of the y axis, with a spacing from each other in the direction of the x axis. The semiconductor regions 26 and 27 are partly contiguous to the fifth semiconductor region 28, partly to the p type sixth and seventh semiconductor regions 29 and 30, and are in ohmic contact with the third and fourth electrodes 21a and 22a. The semiconductor regions 29 and 30 are intended to reduce the areas of contact of the semiconductor regions 26 and 27 with the semiconductor region 28.

The Hall voltage is to be obtained between the third and fourth semiconductor regions 26 and 27 when the control current $I_0$ is made to flow across the semiconductor region 28 from the first 24 to the second 25 semiconductor region, with a magnetic field perpendicular to the direction of current flow. Therefore, the term "primary working region" of the Hall-effect device, as used herein and in the claims appended hereto, may be construed as the fifth semiconductor region 28 or, more strictly, that part of the region 28 which lies intermediate the semiconductor regions 24 and 25 and intermediate the semiconductor regions 26 and 27.

As indicated in both FIGS. 2 and 8, the semiconductor substrate 23 has a laminar insulation 32 formed on its top surface, as seen in this figure, and a layer 33 of aluminum or like metal formed on its bottom surface. The laminar insulation 32 is shown to be composed of three layers or laminae 32a, 32b and 32c of silicon oxides and another layer 32d of adhesive material in this embodiment of the invention.

It has been stated with reference to FIG. 3 that the electrodes 19a–22a are connected via the conductor strips 19b–22b to the terminals 19c–22c, respectively, of the Hall-effect device. As will be understood from both FIGS. 1 and 2, the conductor strips 19b–22b, typically of aluminum, have parts sandwiched between the insulating layers 32a and 32b. The ends of these parts contact the semiconductor regions 24–27 through windows in the insulating layer 32a. The other ends of the conductor strips 19b–22b are connected to the terminals 19c–22c through windows in the other insulating layers 32b and 32c.

With reference to FIGS. 1–3 and 8 the top shielding layer 50 is a layer of electroconductive material such as molybdenum, formed on the second insulating layer 32b as by vapor deposition, sputtering, or plating. The top shielding layer 50 is so sized and positioned as to cover at least the semiconductor region 28, as seen in a plan view as in FIGS. 1 and 3, and electrically connected to the Hall-effect device terminal 22c which is grounded. Formed by vapor deposition or sputtering, the third insulating layer 32c overlies the top shielding layer 50.

The conductor strip 15 for carrying the current fraction $Is_2$, set forth with reference to FIG. 1, is formed on the third insulating layer 32c. Preferably, the conductor strip 15 is fabricated from gold by plating, vapor deposition, or sputtering to a thickness of from about five to thirteen micrometers. The fourth insulating layer 32d is formed on the third insulating layer 21c following the formation of the conductor strip 15 thereon.

Overlying the fourth insulating layer 32d is the magnetic collector 51 which is of magnetic material in sheet form that is higher in magnetic permeability than air, examples being ferrite, iron, and nickel. The magnetic collector 51 is attached to the fourth insulating layer 324 which is of a synthetic adhesive, so as to cover at least all of the semiconductor 9 region 28 as seen from above in FIG. 8. Alternatively, however, the magnetic collector could be a film of magnetic material formed on the insulating layer 32d as by vapor deposition or coating.

Figure 5:
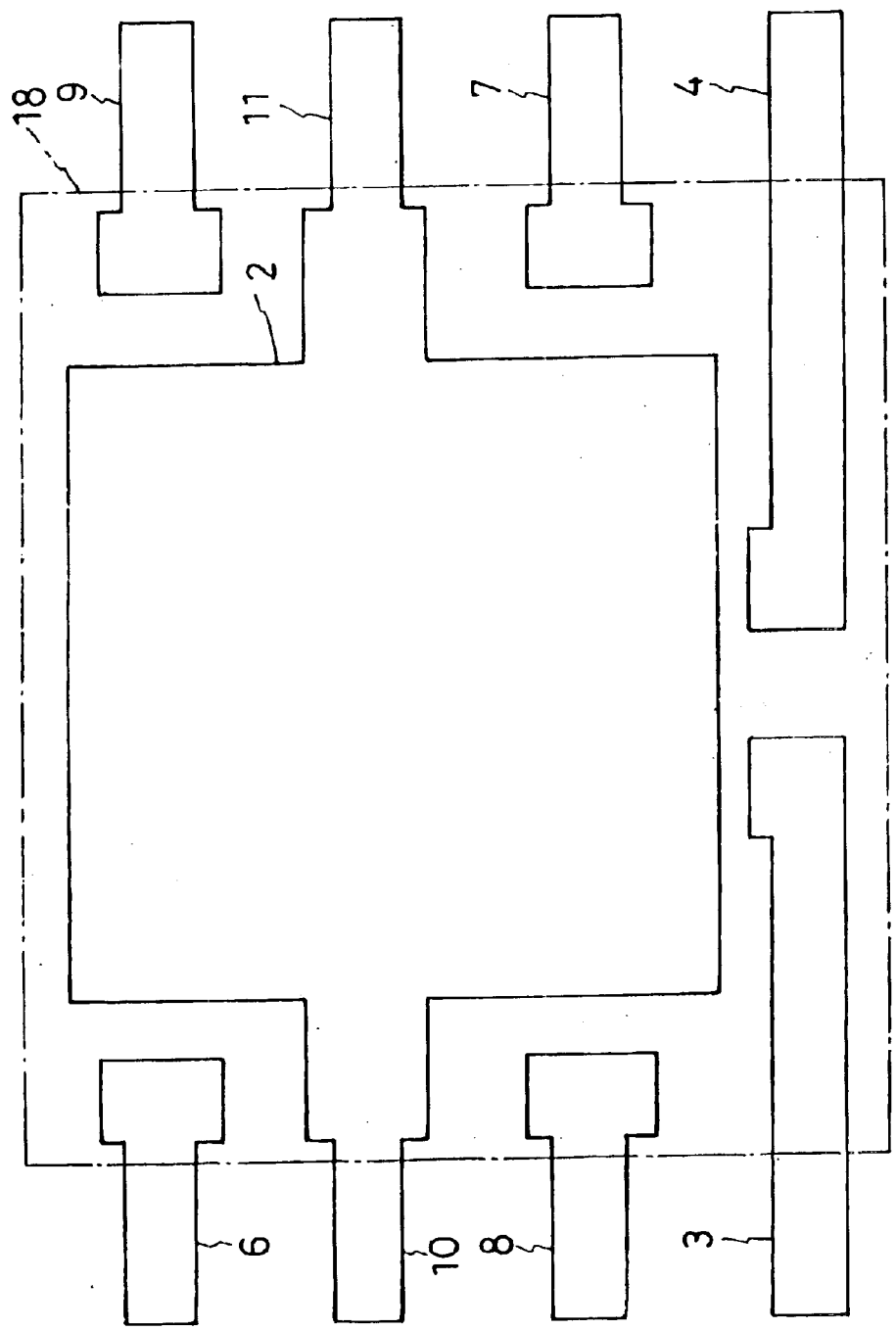
FIG. 5 is a plan view showing the sheet-metal baseplate, pair of current-path terminals, and other terminals of the FIG. 1 current detector in their relative positions.

FIG. 5 best indicates that the metal-made baseplate 2 is approximately square in shape and, as clearly revealed in FIG. 2, somewhat larger in size than the Hall-effect device 1. The baseplate 2 is designed to serve not only as mechanical support for the Hall-effect device 1 but as heat radiator and, further, as electrostatic shield. For successful fulfillment of all such intended functions the baseplate 2 may be fabricated from sheet copper of 0.5 to 2.0 millimeter in thickness with a nickel plating thereon.

The two terminals 10 and 11 extend from the pair of opposite edges of the baseplate 2 for grounding. The current path terminals 3 and 4 extend along one of the other two opposite edges of the baseplate 2, with spacings therefrom and a spacing from each other. The terminals 6–9 for connection of the Hall-effect device to external circuits are also spaced from the baseplate 2. Mechanically, however, the Hall-effect device 1 and the terminals 3, 4, 6–11 are all firmly interconnected by the plastic encapsulation 18, indicated in phantom outline in FIG. 5, closely enveloping the complete current detector, leaving exposed parts of these terminals.

Figure 6:
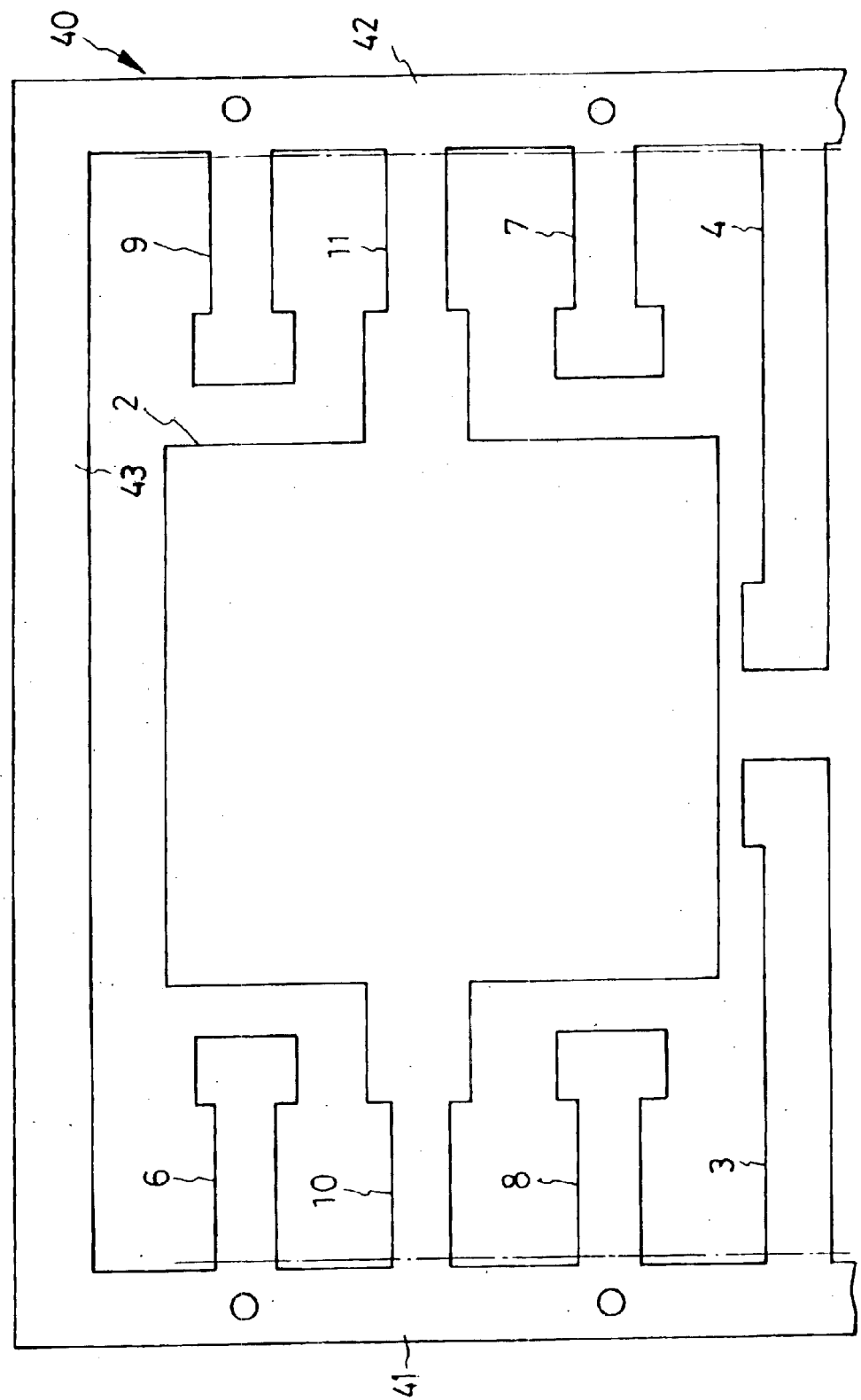
FIG. 6 is a plan view of a sheet-metal punching for use in the fabrication of the baseplate and terminals shown in FIG. 5.

The baseplate 2 and the terminals 3, 4 and 6–11 can all be fabricated from a sheet-metal punching shown in FIG. 6 and therein generally designated 40. The punching 40 has a frame portion 41 holding the terminals 3, 6, 8 and 10 in their prescribed relative positions, another frame portion 42 likewise holding the terminals 4, 7, 9 and 11, and still another frame portion 43 interconnecting the foregoing two frame portions 41 and 42. All the terminals 3, 4 and 5–11 are to be cut off the frame portions 41 and 42 along the dot-and-dash lines after the complete device has been encapsulated. Although FIG. 6 shows a punching fragment for the baseplate and set of terminals of one Hall-effect device, it is understood that in practice a punching is fabricated which is constituted of many such fragments.

The insulating plate 16, FIGS. 1, 2, 4 and 8, is an approximately square piece of sheet ceramic, among other insulating materials, which is slightly larger in size than the Hall-effect device 1. Overlying the baseplate 2 as in FIG. 2, the insulating plate 16 functions to electrically insulate the Hall-effect device 1 from the baseplate as well as to mechanically support the device.

Directly overlying the insulating plate 16 as in FIGS. 2 and 8, the bottom shielding layer 17 is a sheet of magnetic material of approximately the same shape and size therewith. Preferred magnetic materials are iron, nickel, cobalt, and like conductors capable of shielding the Hall-effect device from the influence of external electric and magnetic fields. Alternatively, the bottom shielding layer 17 may be a lamination of a conductive and a magnetic layer, or it may be made from a nonmagnetic conductor such as copper and molybdenum or from a magnetic insulator such as ferrite. The bottom shielding layer 17 is wired at 17a, FIG. 1, to the lead terminal 10. In addition to magnetically shielding the Hall-effect device 1, this layer is intended to serve as magnetic collector, diminishing the magnetic resistance of the path of the magnetic flux created by current flow through the conductor strip 15 forming a major part of the second current path.

A consideration of FIGS. 2 and 8 will show that the insulating plate 16 with the bottom shielding layer 17 thereon is bonded to the baseplate 2 via an adhesive layer 34. The noted metal layer 33 bounding the bottom of the Hall-effect device 1 is secured to the bottom shielding layer 17 via a layer 35 of solder or like conductive bonding agent.

As has been stated with reference to FIGS. 3 and 7, the electrodes 19a–22a of the Hall-effect device 1 are electrically connected to the four semiconductor regions 24–27, respectively, of the semiconductor substrate 23 on the one hand and, on the other hand, to the terminals 19c–22c via the conductor strips 19b–22b. These terminals 19c–22c of the Hall-effect device 1 are wired at 36–39, FIG. L, to the lead terminals 6–9, respectively, of the current detector.

Typically made from aluminum, the wire 12 interconnecting the current path terminals 3 and 4 is for formation of the first, direct current path from terminal 3 to terminal 4. This first current path is to carry the first fraction $Is_1$ of the current Is to be detected or measured, as that current is divided into the two fractions $Is_1$ and $Is_2$ at the end of the terminal 3. A description of the second, indirect current path from terminal 3 to terminal 4, for carrying the second current fraction $Is_2$ to be actually translated into a voltage output by the Hall-effect device 1, follows.

As seen in FIGS. 1, 3, 7 and 8, the conductor strip 15 of aluminum or the like is formed on the insulating layers 32 so as to surround, as seen in a plan view, the semiconductor region 28, the main working part, in the broader sense of the term, of the Hall-effect device 1. The conductor strip 15 should surround at least about three quarters, preferably ninety-five percent or so, of the periphery of the main working part is of the Hall-effect device 1.

The conductor strip 15 has one extremity thereof coupled to the first current path terminal 3 via the aluminum wire 13, and the other extremity thereof coupled to the second current path terminal 4 via the aluminum wire 14, thereby completing the second current path, which is in parallel with the first current path, for carrying the second current fraction $Is_2$ from terminal 3 to terminal 4 via the Hall-effect device 1. So arranged and electrically connected to the current path terminals 3 and 4, the conductor layer 15 is designed to apply to the Hall-effect device 1 the magnetic flux due to the flow of the second current fraction $Is_2$ therethrough.

Operation

Let us assume that the resistances of the two current path terminals 3 and 4 are negligibly small. Then the current fractions $Is_1$ and $Is_2$ divided between the two current paths are defined as:

$$Is_1 = Is[R_2/(R_1+R_2)]$$

$$Is_2 = Is[R_2/(R_1+R_2)]$$

where
  $R_1$ = the resistance of the wire 12 throughout its length,
  $R_2$ = the resistance of the total length of the wire 13, the conductor layer 15 and the wire 14.

For detection or measurement of the current Is flowing through some electric circuit under measurement, by the current detector of the above described construction, the current path terminals 3 and 4 may be serially connected to the desired electric circuit. The lead terminals 6 and 7 may be connected to the unshown control current supply circuit for causing the control current Ic, FIG. 7, to flow between the semiconductor regions 24 and 25, and the other lead terminals 8 and 9 to the unshown amplifier for applying thereto the Hall voltage indicative of the magnitude of the current Is.

Flowing into the current detector from the current path terminal 3, the current Is to be measured will be divided into $Is_1$ and $Is_2$. The first fraction $Is_1$ will flow from terminal 3 to terminal 4 by way of the wire 12, the first current path. The second fraction $Is_2$ will flow from terminal 3 to terminal 4 by way of the second path constituted of the wire 13, conductor strip 15, and wire 14. As the second fraction $Is_2$ flows through the conductor strip 15 around the main working part of the Hall-effect device 1, the magnetic field H will be generated which, according to the Ampere rule, is oriented in the direction indicated by the broken-line arrows in FIG. 8. This direction of the magnetic field is perpendicular to the direction of the control current Ic in the semiconductor region 28, so that the Hall voltage will be generated between the semiconductor regions 26 and 27, hence between the electrodes 21 and 22, and hence between the lead terminals 8 and 9. The Hall voltage is proportional to the strength of the magnetic field H, which in turn is proportional to the magnitude of the current Is, so that this current is detectable from the Hall voltage.

The advantages gained by the above described embodiment of the invention may be summarized as follows:

1. The top shielding layer 50 thoroughly covers the top side of so most of the Hall-effect device 1 notably including its primary working part, the semiconductor region 28, so that the voltage across this semiconductor region as detected by the pair of electrodes 21a and 22a is protected against spurious variations due to external disturbances.

2. The baseplate 2 and conductive bonding agent layer 35a serve conjointly to shield the bottom side of the Hall-effect device 1, making the device all the more immune to inductive and other noise.

3. The shielding layer 50 is compactly sandwiched between the insulating laminae 32b and 32c on the semiconductor substrate 23.

4. The magnetic collector 51 makes it possible for the magnetic flux, created by current flow through the conductor strip 15, to be directed most efficiently into the semiconductor region 28, with the consequent enhancement of the efficiency of current detection.

5. Directly overlying the insulating layers 32 on the surface of the semiconductor substrate 23, the conductor strip 15 for carrying the current fraction $Is_2$ is situated as close as practical to the Hall-effect device 1 formed in the substrate, again for higher detection sensitivity.

6. As the conductor strip 15 surrounds some ninety-five percent of the periphery of the Hall-effect device 1, the magnetic lines of force will act on the semiconductor region 28 from all of its four sides, giving still another cause for enhanced sensitivity.

7. All but parts of the terminals 3, 4 and 6–11 of the current detector is encapsulated for greater structural stability and operational reliability.

8. The current Is is not directly detected but in terms of its division $Is_2$ directed through the conductor strip 15 on the semiconductor substrate 23. Therefore, if the ratio of $R_1$ to $R_2$ is set at one to nine, for instance, then the current $Is_2$ actually flowing through the conductor strip 15 can be as small as 10 amperes when the current Is to be detected is 100 amperes.

9. The wire 12 providing the first current path, and the wires 13 and 14 and the conductor strip 15 providing the second current path, are both enclosed in one and the same plastic package 18. The temperature difference between the two current paths is thus reduced to a minimum, as are variations in the relative magnitudes of the currents $Is_1$ and $Is_2$ due to the temperature difference.

10. The three wires 12, 13 and 14 used for formation of the two current paths are of the same material and so have the same rate of change in resistance du to the ambient temperature. The current Is is therefore divisible at an unvarying rate in the face of temperature variations, resulting in highly accurate current detection.

11. The Hall-effect device 1 is sufficiently electrically isolated from the baseplate 2 by the insulating plate 16.

12. Noise due to external magnetic and electric disturbances is a eliminated by the bottom shielding layer 17.

13. The baseplate 2 and the terminals 3, 4 and 6–11 are inexpensively fabricated from common sheet-metal punchings.

Second Form

Figure 9:
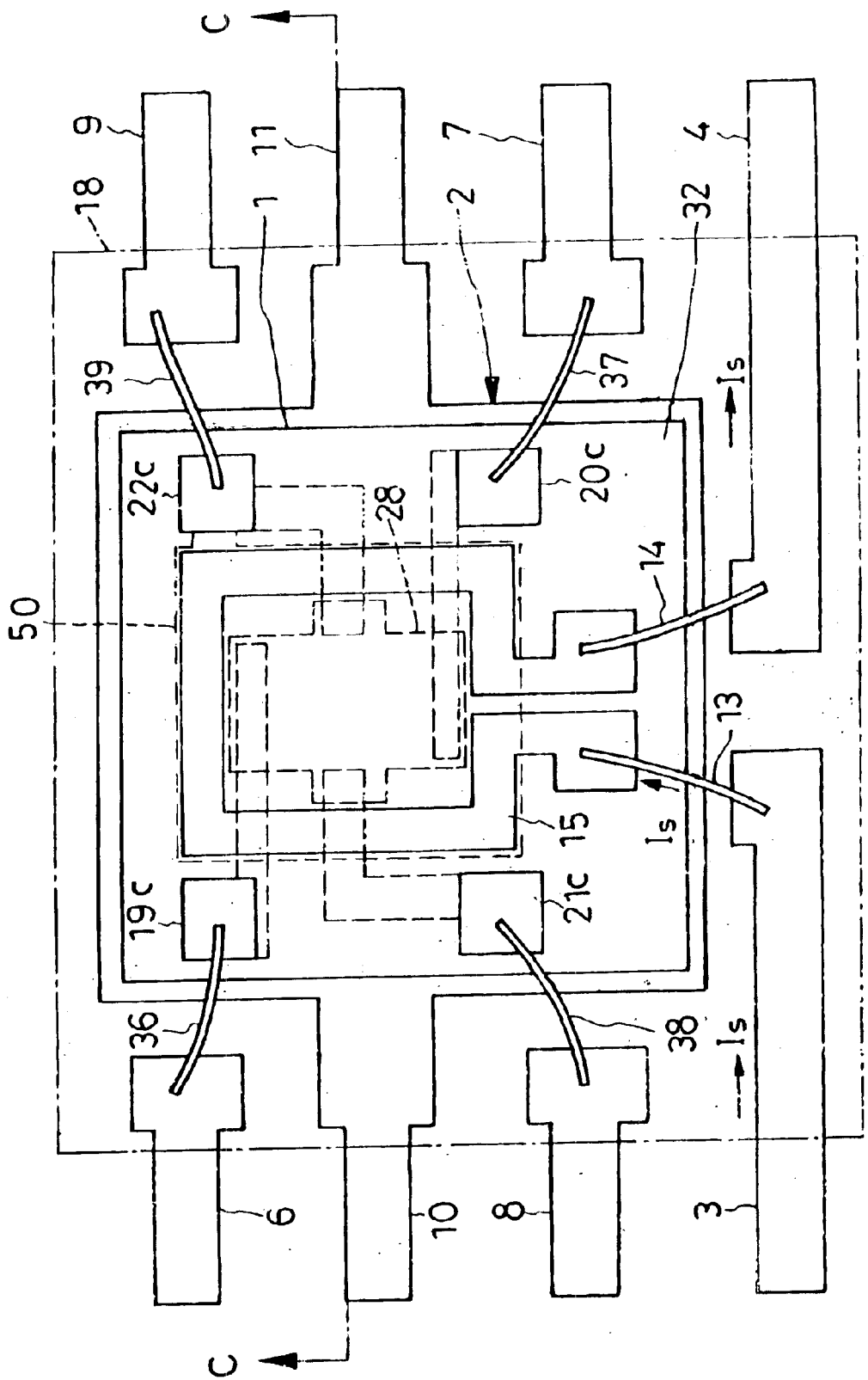
FIG. 9 is a view similar to FIG. 1 but showing an alternative embodiment of the invention.
Figure 10:
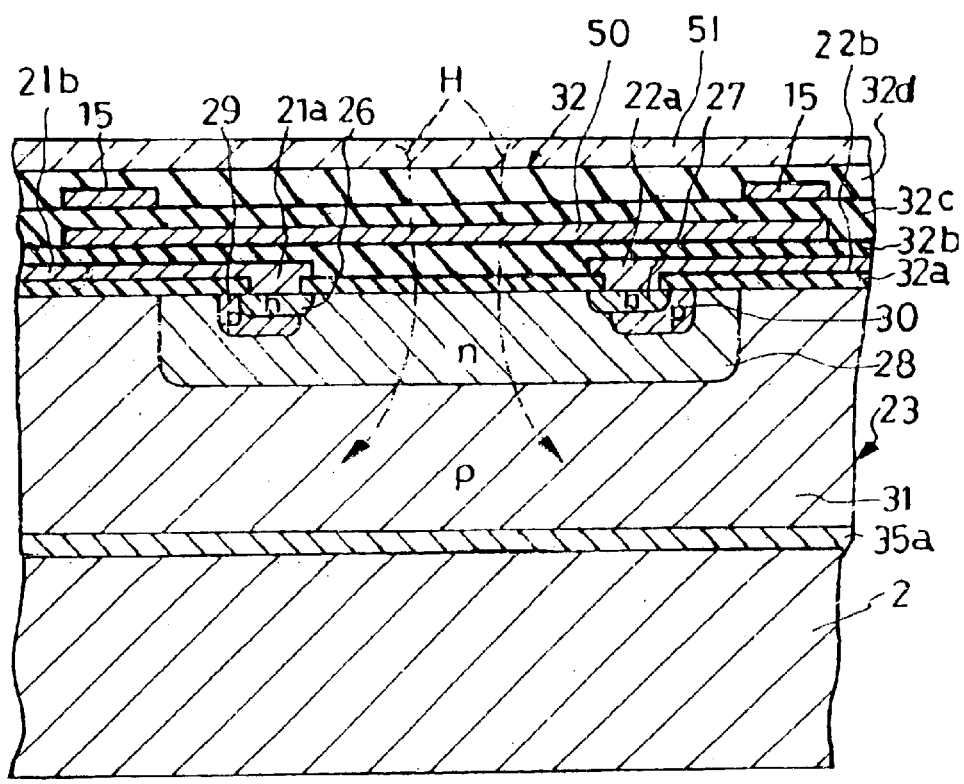
FIG. 10 is an enlarged, fragmentary section through the Hall-effect device of the FIG. 9 current detector, taken along the line C—C in FIG. 9.

FIGS. 9 and 10 show, in views similar respectively to FIGS. 1 and 8, a second preferred form of current detector according to the invention. As will be understood from a comparison of these figures, this second form differs from the first in the following respects, the other details of construction being alike in both forms:

1. The insulating plate 16, bottom shielding layer 17, metal layer 33, insulating adhesive layer 34 and conductive bonding layer 35 of the first current detector are absent from the second.

2. The baseplate 2 is bonded directly to the underside of the semiconductor substrate 23, as of gallium arsenide, via a layer 35a of a conductive bonding agent such as silver.

There being no wire 12 directly interconnecting the two current path terminals 3 and 4, the incoming current Is is wholly directed into the conductor strip 15 and detected by the Hall-effect device 1. This second embodiment nevertheless gains all but 8–12 of the thirteen advantages set forth for the first embodiment.

Third Form

Figure 11:
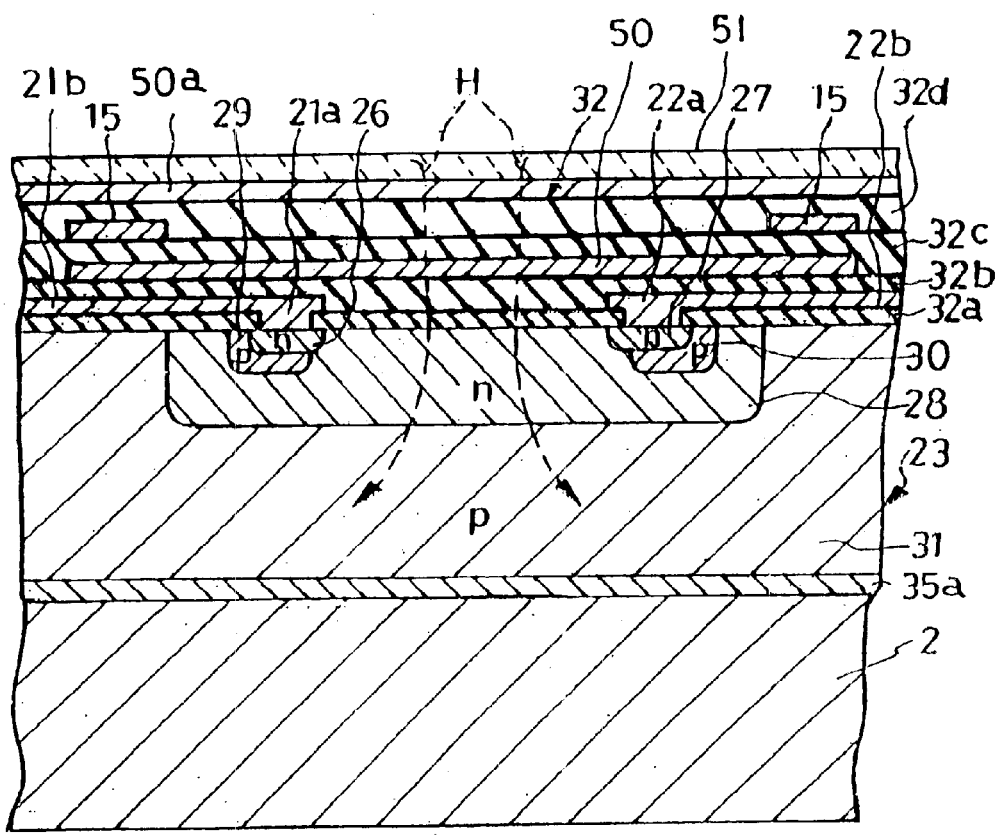
FIG. 11 is a view similar to FIG. 10 but showing another alternative, embodiment of the invention.

In FIG. 11 is shown still another preferred from of current detector according to the invention, which is similar to the FIGS. 9 and 10 embodiment except for the addition of a second shielding layer 50a. Like the second embodiment this third has the first shielding layer 50 between conductor strip 15 and semiconductor substrate 23. The second shielding layer 50a, which may be of molybdenum, is formed between insulating 3 layer 32d and magnetic collector 51.

Despite the showing of FIG. 11, however, the first shielding layer 50 could be omitted, provided that the device was rendered amply noise-proof by the second shielding layer 50a alone. As another modification of this FIG. 11 embodiment, the shielding layer 50a could be formed on, instead of under, the magnetic collector 51.

Notwithstanding the foregoing detailed disclosure, it is not desired that the present invention be limited by the exact showings of the drawings or by the description thereof. The following is a brief list of possible modifications, alterations and adaptations of the illustrated embodiments that will readily suggest themselves to the specialists on the basis of this disclosure:

1. The semiconductor substrate 23 could be fabricated from semi-conductors such as 3–5 group compounds other than silicon or gallium arsenide. Although the resulting substrate would be more susceptible to external magnetic fields or inductive noise, the shielding layers 17, 50 or 50a would more than amply offset this shortcoming.

2. The insulating plate 16 and bottom shielding layer 17 could be omitted from the first embodiment, with the Hall-effect device 1 formed directly on the baseplate 2.

3. A Hall-voltage amplifier could be built into the same semiconductor substrate as was the Hall-effect device 1.

4. Two or more Hall-effect devices could be formed in one and the same semiconductor substrate, thereby conjointly detecting the current with higher sensitivity.

All these and other similar changes of the invention are intended in the foregoing disclosure. It is therefore appropriate that the invention be construed broadly and in a manner consistent with the fair meaning or proper scope of the claims which follow.

What is claimed is:

1. A semiconductor detector of improved noise immunity for detecting or measuring an electric current, comprising:

(a) a semiconductor substrate having a Hall-effect device formed therein from one surface thereof, the Hall-effect device having a plurality of semiconductor regions including a primary working region for generating a voltage proportional to the magnitude of a current to be detected or measured;

(b) a first insulating layer formed on said one surface or the semiconductor substrate so as to cover the Hall-effect device;

(c) a plurality of electrodes formed on the first insulating layer and electrically connected respectively to some of the semiconductor regions of the Hall-effect device through windows in the first insulating layer;

(d) a plurality of conductor strips formed on the first insulating layer and electrically connected respectively to the electrodes;

(e) a second insulating layer formed on the first insulating layer and covering the electrodes and the conductor strips;

(f) a shielding layer formed on part of the second insulating layer so as to cover at least part of the primary working region of the Hall-effect device;

(g) a third insulating layer formed on the second insulating layer and covering the shielding layer; and (h) a conductor strip formed on the third insulating layer so as to extend around at least part of the primary working region of the Hall-effect device, for carrying at least a prescribed fraction of the current to be detected or measured.

2. The semiconductor current detector of claim 1 further comprising:

(a) a fourth insulating layer formed on the third insulating layer and covering the conductor strip; and (b) a second shielding layer formed on the fourth insulating layer so as to cover at least part of the primary working region of the Hall-effect device.

3. The semiconductor current detector of claim 1 further comprising a magnetic collector formed on the third insulating layer.

4. A semiconductor current detector of improved noise immunity for detecting or measuring an electric current, comprising:

(a) a semiconductor substrate having a Hall-effect device formed therein from one surface thereof, the Hall-effect device having plurality of semiconductor regions including a primary working region for generating a voltage proportional to the magnitude of a current to be detected or measured;

(b) a first insulating layer formed on said one surface of the semiconductor substrate so as to cover the Hall-effect device;

(c) a plurality of electrodes formed on the first insulating layer and electrically connected respectively to some of the semiconductor regions of the Hall-effect device through windows in the first insulating layer;

(d) a plurality of conductor strips formed on the first insulating layer and electrically connected respectively to the electrodes;

(e) a second insulating layer formed on the first insulating layer and covering the electrodes and the conductor strips;

(f) a conductor strip formed on the second insulating layer so as to extend around at least part of the primary working region of the Hall-effect device, for carrying at least a prescribed fraction of the current to be detected or measured;

(g) a third insulating layer formed on the second insulating layer and covering the conductor strip; and (h) a shielding layer formed on the third insulating layer so as to cover at least part of the primary working part of the Hall-effect device.

5. The semiconductor current detector of claim 4 further comprising a magnetic collector formed on the shielding layer.

* * * * *

UNITED STATES PATENT AND TRADEMARK OFFICE
CERTIFICATE OF CORRECTION

PATENT NO. : 6,812,687 B1 Page 1 of 1
DATED : November 2, 2004
INVENTOR(S) : Koji Ohtsuka It is certified that error appears in the above-identified patent and that said Letters Patent is hereby corrected as shown below:

Column 4,
Line 11, delete "$I_o$" and insert therefore -- $I_c$ --.

Column 5,
Line 27, delete "5-11" and insert therefore -- 6-11 --.

Signed and Sealed this

Third Day of May, 2005

JON W. DUDAS
*Director of the United States Patent and Trademark Office*